United States Patent
Deng et al.

(10) Patent No.: US 11,715,618 B2
(45) Date of Patent: Aug. 1, 2023

(54) SYSTEM AND METHOD FOR REDUCING THE CHARGING EFFECT IN A TRANSMISSION ELECTRON MICROSCOPE SYSTEM

(71) Applicant: FEI Company, Hillsboro, OR (US)

(72) Inventors: Yuchen Deng, Eindhoven (NL); Alexander Henstra, Eindhoven (NL); Peter Tiemeijer, Eindhoven (NL)

(73) Assignee: FEI Company

( * ) Notice: Subject to any disclaimer, the term of this patent is extended or adjusted under 35 U.S.C. 154(b) by 67 days.

(21) Appl. No.: 17/392,758

(22) Filed: Aug. 3, 2021

(65) Prior Publication Data
US 2023/0040558 A1   Feb. 9, 2023

(51) Int. Cl.
*H01J 37/02*  (2006.01)
*H01J 37/244* (2006.01)
*H01J 37/04*  (2006.01)

(52) U.S. Cl.
CPC .......... *H01J 37/026* (2013.01); *H01J 37/045* (2013.01); *H01J 37/244* (2013.01); *H01J 2237/0045* (2013.01); *H01J 2237/2448* (2013.01)

(58) Field of Classification Search
CPC ...... H01J 37/026; H01J 37/045; H01J 37/244; H01J 2237/0045; H01J 2237/2448
See application file for complete search history.

(56) References Cited

U.S. PATENT DOCUMENTS

| | | | | |
|---|---|---|---|---|
| 9,048,060 | B2* | 6/2015 | Kieft | H01J 37/045 |
| 2006/0043982 | A1* | 3/2006 | Shinada | G01R 31/305 |
| | | | | 324/754.22 |
| 2008/0302964 | A1* | 12/2008 | Shinada | G01R 31/307 |
| | | | | 324/750.23 |
| 2014/0103225 | A1* | 4/2014 | Kieft | H01J 37/045 |
| | | | | 250/440.11 |
| 2020/0013580 | A1* | 1/2020 | Henstra | H01J 37/26 |

* cited by examiner

*Primary Examiner* — David A Vanore

(57) ABSTRACT

Systems and methods for reducing the buildup of charge during the investigation of samples using charged particle beams, according to the present disclosure include irradiating a first portion of a sample during a first time period, wherein the irradiating the first portion of the sample causes a gradual accumulation of net charge in the first portion of the sample, generating imaging data based on emissions resultant from irradiating the first portion of the sample, and then irradiating a second portion of a sample holder for a second time period. The methods may further includes iteratively repeating the irradiation of the first portion and the second portion during imaging of the sample region. When more than one region of interest on the sample is to be investigated, the method may also include continuing to image additional portions of the sample by iteratively irradiating a region of interest on the sample and a corresponding portion of the sample holder.

20 Claims, 10 Drawing Sheets

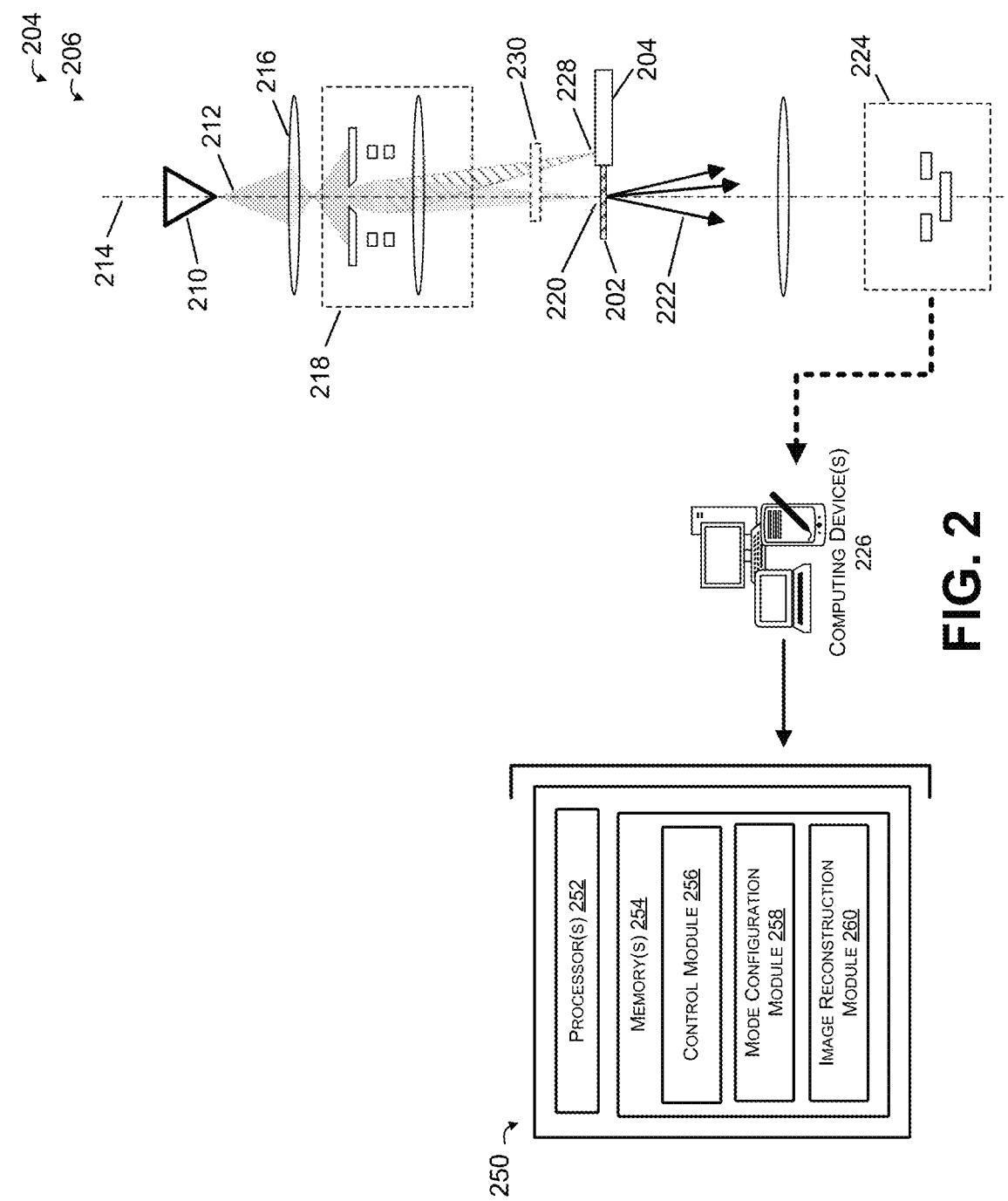

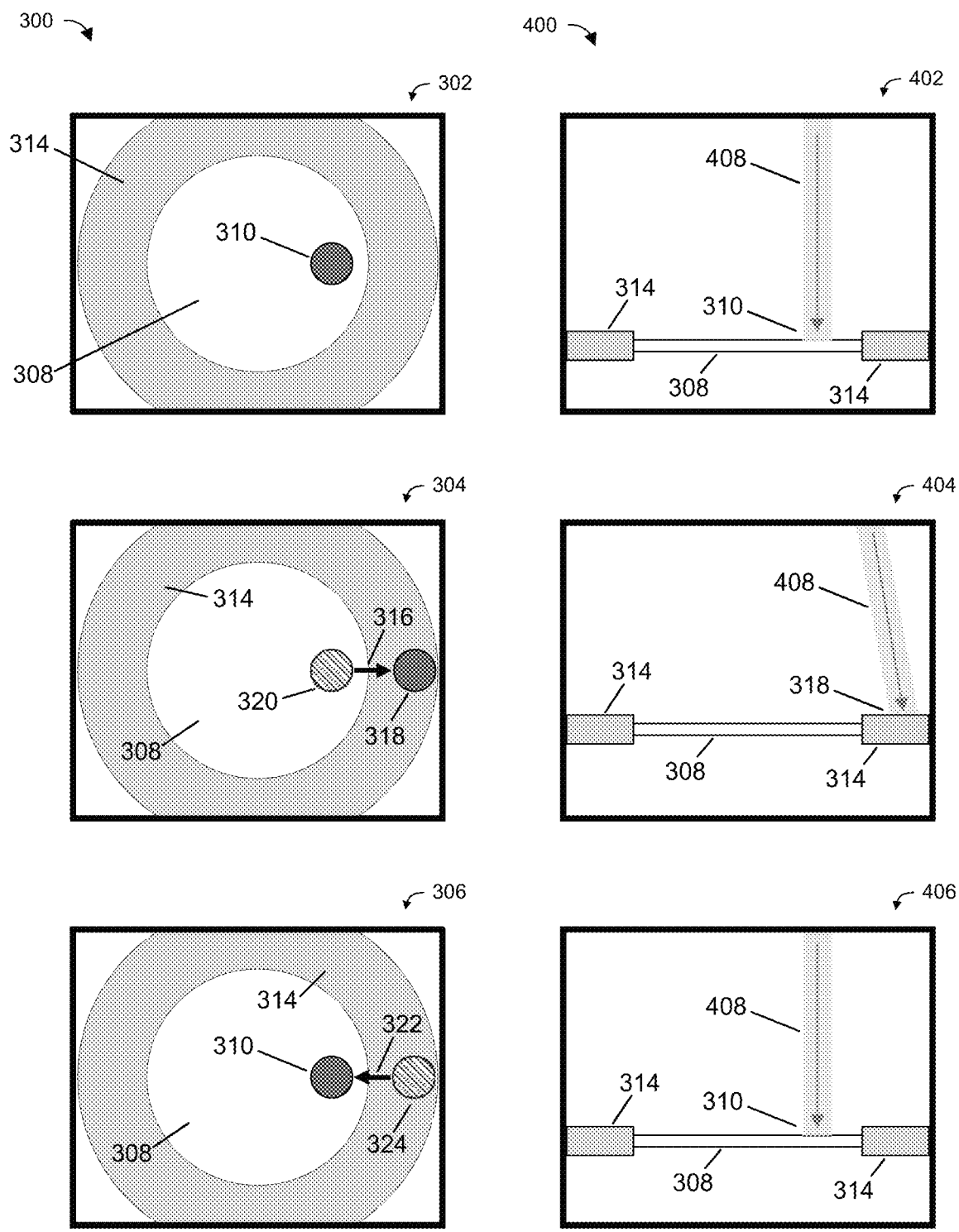

SYSTEM AND METHOD FOR REDUCING THE CHARGING EFFECT IN A TRANSMISSION ELECTRON MICROSCOPE SYSTEM

BACKGROUND OF THE INVENTION

A major limitation in imaging resolution for current transmission electron microscopy (TEM) is the buildup of charge caused during irradiation of insulating specimens. As the electron beam irradiates an insulating sample, the beam induces the ejection of secondary and Auger electrons. Because electrons are unable to redistribute across an insulating sample, this ejection results in a positive net charge in the irradiated area. This deposit of charge then creates an electromagnetic field which affects the path electrons travel to the TEM imaging detectors, resulting in a distortion/reduction in image resolution. This deposit of charge also causes a Coulomb force that acts on the sample, and may cause sample deformation.

FIG. 1 illustrates how such sample charging occurs during an example TEM investigation 100 of an insulating sample 102. During the investigation 100, an electron beam 104 inducing a net emission of electrons 106 from the sample such that a positive charge 108 builds up in the region being investigated. FIG. 1 further shows how some of the emitted electrons 106 may be deposited on other portions of the sample and/or sample holder such that a negative charge 110 is build up in these areas. As would be understood by those in the art, these charge deposits result in the creation of electromagnetic fields 112 which interfere with electrons 106 as they pass to the TEM imaging detectors 114. This interference results in inaccurate sample information, and thus reduced resolution of images generated from such detector data. As the charges 108 and 110 get larger, the electromagnetic fields 112 become more powerful, which results in greater distortion of electron paths. Additionally, the buildup of charge is very dynamic such that the electromagnetic fields (and the forces on the emissions 106) are dynamically changing. In this way, the buildup of charge caused during irradiation of insulating specimens causes the quality of the detector data obtained by a TEM system to rapidly degrade. This is especially harmful to cryomicroscopy images as amorphous ice is an insulator without a natural ground. Accordingly, there is a need for a solution that allows for insulative samples to be investigated with a charged particle beam without the investigation generating a buildup of charge on the sample.

Current TEM systems address this charging issue by having a portion of the sample holder be irradiated during investigation of the sample. By having at least a portion of an electron beam be incident on a conductive sample holder, the sample holder is caused to emit electrons which may then be drawn to the buildup of positive charge on the sample. In this way, as the electron beam causes a buildup of charge on the sample the electrons emitted by the sample holder compensate for this buildup, thus preventing the reduction of imaging resolution of the TEM system.

A first current TEM system employs a second charged particle beam that is incident on the sample holder during the irradiation of the sample. However, this system requires multibeam technology which increases the cost and complexity of the optical column of the TEM system. Additionally, since current multibeam systems cannot independently translate individual beams in the sample plane (i.e., changing the geometric relationship of the two beams in the sample plane currently requires a change in magnification or a reconfiguration of the TEM optical column), this dual beam solution to sample charging can only be conducted for specific sample/sample holder geometries.

Another current TEM process addresses this sample charging limitation by having the electron beam both a portion of the sample and a portion of the sample holder (e.g., irradiate at the edge of the sample such that portion of the beam is incident on the sample holder). However, this solution limits the regions of the sample that can be investigated to portions of the sample proximate to the sample holder. Accordingly, it is desired to have new systems and methods that reduce the buildup of charge during the investigation of samples with charged particle beams without requiring complex multibeam technology or limit the regions of the sample that can be investigated.

SUMMARY

Methods for reducing the buildup of charge during the investigation of samples using charged particle beams, according to the present disclosure include irradiating a first portion of a sample during a first time period, wherein the irradiating the first portion of the sample causes a gradual accumulation of net charge in the first portion of the sample, generating imaging data based on emissions resultant from irradiating the first portion of the sample, and then irradiating a second portion of a sample holder for a second time period. Irradiating the second portion of the sample holder causes secondary electrons to be released to compensate for the deposit of charge. The methods may further include iteratively repeating the irradiation of the first portion and the second portion during imaging of the sample region. When more than one region of interest on the sample is to be investigated, the method may also include continuing to image additional portions of the sample by iteratively irradiating a region of interest on the sample and a corresponding portion of the sample holder.

Systems for reducing the buildup of charge during the investigation of samples using charged particle beams, according to the present disclosure include a charged particle emitter configured to emit a charged particle beam towards a sample, a sample holder configured to hold the sample, and a detector system configured to detect emissions resultant from the irradiation of the sample with the charged particle beam. The systems also include one or more processors, and a memory that stores non-transitory computer-readable instructions that, when executed on the one or more processors, cause the system to irradiate a first portion of the sample during a first time period, wherein the irradiating the first portion of the sample causes a gradual deposit of charge in the first portion of the sample, generate imaging data based on emissions resultant from irradiating the first portion of the sample, and irradiate a second portion of the sample holder for a second time period, wherein the irradiating the second portion of the sample holder causes secondary electrons to be released to compensate the deposit of charge. The instructions may also cause the system to iteratively repeat the irradiation of the first portion and the second portion during imaging of the sample region.

BRIEF DESCRIPTION OF THE DRAWINGS

The detailed description is described with reference to the accompanying figures. In the figures, the left-most digit(s) of a reference number identify the figure in which the reference number first appears. The same reference numbers in different figures indicate similar or identical items.

FIG. 2 illustration of an example environment for reducing the buildup of charge during the investigation of samples by deflecting the imaging beam between a first location on a sample and a second location on the sample holder.

FIGS. 3 and 4 are diagrams that illustrate a top down view and side view, respectively, of a TEM investigation of a sample where the buildup of charge during the investigation is reduced by deflecting the imaging beam between a first location on a sample and a second location on the sample holder.

Figure 1:
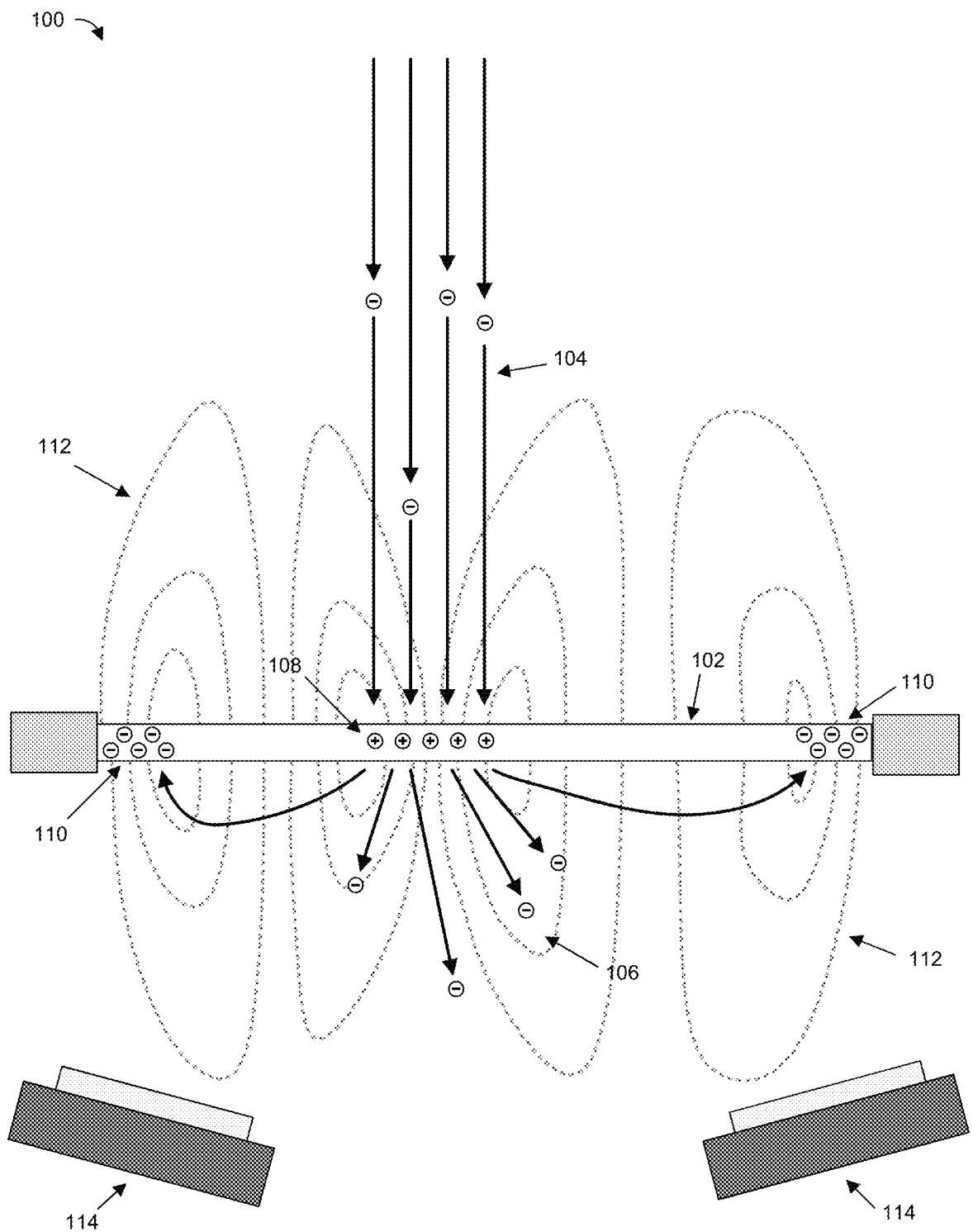
FIG. 1 illustrates sample charging occurs during an example TEM investigation of an insulating sample.

Like reference numerals refer to corresponding parts throughout the several views of the drawings. Generally, in the figures, elements that are likely to be included in a given example are illustrated in solid lines, while elements that are optional to a given example are illustrated in broken lines. However, elements that are illustrated in solid lines are not essential to all examples of the present disclosure, and an element shown in solid lines may be omitted from a particular example without departing from the scope of the present disclosure.

DETAILED DESCRIPTION OF EMBODIMENTS

Methods and systems for reducing the buildup of charge during the investigation of samples using charged particle beams are disclosed herein. More specifically, the disclosure includes improved methods and systems for compensating for the buildup of charge during TEM sample investigation such that the resolution of generated images is not reduced. In some embodiments of the present disclosure, the TEM systems rapidly deflect the electron beam between a first location on the sample (i.e., a region of interest that is being imaged) and a second location that is on the sample holder. By rapidly toggling between the first location and the second location, the amount of charge that is built up is during the portion of time in which the first location is irradiated is compensated by electrons emitted by the sample holder during the time in which the second location is irradiated. The frequency and length of the iterations can be adjusted based on the sample type, the detector type, desired imaging characteristics, or a combination thereof. Additionally, in some embodiments of the present disclosure, the TEM systems are able to individually translate a second electron beam in relation to a first electron beam in the sample plane without having to adjust the magnification of the system or reconfigure the optical column of the TEM system. Some of the optical columns of such TEM systems include a holey biprism, this translation of the second electron beam is caused by a change in the voltage applied to the body of the holey biprism.

FIG. 2 is an illustration of example environment 200 for reducing the buildup of charge during the investigation of samples by deflecting the imaging beam between a first location on a sample 202 and a second location on the sample holder 204. Specifically, FIG. 2 shows example environment 200 as including example charged particle system(s) 206 for investigation and/or analysis of a sample 202. The example charged particle system(s) 206 may be or include one or more different types of optical, and/or charged particle microscopes, such as, but not limited to, a scanning transmission electron microscope (STEM), a transmission electron microscope (TEM), a charged particle microscope (CPM), a cryo-compatible microscope, focused ion beam microscope (FIBs), dual beam microscopy system, or combinations thereof. FIG. 2 shows the example charged particle microscope system(s) 206 as being a transmission electron microscope (TEM) 208.

The example charged particle microscope system(s) 206 includes a charged particle source 210 (e.g., a thermal electron source, Schottky-emission source, field emission source, etc.) that emits an electron beam 212 along an emission axis 214 and towards an accelerator lens 216. The emission axis 212 is a central axis that runs along the length of the example charged particle microscope system(s) 206 from the charged particle source 210 and through the sample 202. The accelerator lens 216 that accelerates/decelerates, focuses, and/or directs the electron beam 212 towards a focusing column 218. The focusing column 218 focuses the electron beam 212 so that it is incident on at least a portion of the sample 202. In some embodiments, the focusing column 218 may include one or more of an aperture, scan coils, and upper condenser lens. The focusing column focuses electrons from electron source into a small spot on the sample. Different locations of the sample 202 may be scanned by adjusting the electron beam direction via the scan coils. Additionally, the focusing column 218 may correct and/or tune aberrations (e.g., geometric aberrations, chromatic aberrations) of the electron beam 212.

During TEM imaging, the electron beam 212 is directed such that it irradiates and/or passed through a region of interest at a first location 220 on the sample 202. A portion of the electrons 222 passing through sample 202 and/or emissions 222 caused by the electron beam 212 impinge on a microscope detector system 122. In this way, electrons and/or emissions generated during irradiation of the first location 220 are captured by the detector system 122, which then generates detector data that can be used to create a reconstruction of the region of interest of the sample 202. In FIG. 2, the microscope detector system 224 is illustrated as including a disk-shaped bright field detector and dark field detector(s). In some embodiments, the microscope detector system 224 may include one or more other detectors. Alternatively, or in addition, the microscope detector system 224 may include a scanning electron microscope detector system, a focused ion beam detector system, a scanning electron microscope secondary electron detector system, a focused ion beam secondary electron detector system, and an optical microscope detector system.

FIG. 2 further illustrates the example charged particle microscope system(s) 206 as further including a sample holder 204 and computing device(s) 226. The sample holder 204 is configured to hold the sample 202, and is able to translate, rotate, and/or tilt the sample 206 in relation to the example charged particle microscope system(s) 206. While the sample 202 is depicted as a lamella attached to a sample holder capable of manipulating the lamella within the vacuum chamber, in other embodiments the sample holder may be a structure that includes one or more sample supports (e.g., mesh, foil, grids, etc.) configured to contain the sample, and which is configured to inserted into the charged particle microscope system(s) 206 and attached/connected to sample stage that is able to translate, rotate, and/or tilt the sample holder 204 in relation to the example charged particle microscope system(s) 206. For example, the sample holder 204 may comprise a sample support such as a conductive foil that defines apertures where a sample 202 can be held for TEM investigation. In cryo-TEM, the sample 202 may correspond to biological or other matter (e.g., proteins) suspended in amorphous ice located within the apertures defined by a conductive sample holder foil.

However, as the sample 202 is irradiated a charge is build up at and around the first location 220 such that the quality and/or resolution of the detector data is negatively affected. To compensate for this, the computing device(s) 226 are configured to cause the charged particle microscope system (s) 206 to toggle the electron beam 212 from a first mode in which it irradiates the first region 220 on the sample 202 and a second mode in which it irradiates a second region 228 on the sample holder 204. The computing devices 226 may select the frequency and/or and length the beam remains in the iteration of each mode can be adjusted based on the sample type, the detector type, desired imaging characteristics, or a combination thereof. For example, the frequency may be selected based on the speed at which the microscope detector system 224 is able to capture information. Alternatively, or in addition, the length of irradiations may be selected such that enough electrons/emission 222 are generated for the microscope detector system 224 to create quality detector data while ensuring that the amount of charge built up during each individual irradiation of the first region 220 is not enough to substantially affect the quality or resolution of the detector data.

In some embodiments, the computing device(s) 226 cause the particle microscope system(s) 206 to toggle from the first mode to the second mode by controlling one or more deflectors in the focusing column 218. Optionally, the particle microscope system(s) 206 may further include a beam blanker 230 that blanks the beam during the time period where the particle microscope system(s) 206 to switch between the first mode and the second mode. In this way, the optional beam blanker 230 prevents damage of the surface of the sample 202 caused by the electron beam traveling from the first location 220 to the second location 228 in the sample plane. In some embodiments, the computing device (s) 226 may be further configured to cause an additional region of the interest on the sample 202 to be imaged. In such a situation, the beam 212 may irradiate the additional region of interest on the sample 202 when the particle microscope system(s) 206 operates in the first mode, and either the second location 228 or a different location on the sample holder 228 to be irradiated when the particle microscope system(s) 206 operates in the second mode. In this way, the particle microscope system(s) 206 is able to investigate all regions of a sample 202 without the resolution and/or quality of the subsequent images being affected by the sample charging effect of the beam 212.

FIG. 2 further includes a schematic diagram illustrating an example computing architecture 250 of the computing devices 226. Example computing architecture 250 illustrates additional details of hardware and software components that can be used to implement the techniques described in the present disclosure. Persons having skill in the art would understand that the computing architecture 250 may be implemented in a single computing device 226 or may be implemented across multiple computing devices. For example, individual modules and/or data constructs depicted in computing architecture 250 may be executed by and/or stored on different computing devices 226. In this way, different process steps of the inventive method according to the present disclosure may be executed and/or performed by separate computing devices 226.

In the example computing architecture 250, the computing device includes one or more processors 252 and memory 254 communicatively coupled to the one or more processors 252. The example computing architecture 250 can include a control module 256, a mode configuration module 258, and an image reconstruction module 260 stored in the memory 254. As used herein, the term "module" is intended to represent example divisions of executable instructions for purposes of discussion and is not intended to represent any type of requirement or required method, manner or organization. Accordingly, while various "modules" are described, their functionality and/or similar functionality could be arranged differently (e.g., combined into a fewer number of modules, broken into a larger number of modules, etc.). Further, while certain functions and modules are described herein as being implemented by software and/or firmware executable on a processor, in other instances, any or all of modules can be implemented in whole or in part by hardware (e.g., a specialized processing unit, etc.) to execute the described functions. As discussed above in various implementations, the modules described herein in association with the example computing architecture 250 can be executed across multiple computing devices 226.

The control module 256 can be executable by the processors 252 to cause a computing device 226 and/or example charged particle microscope system(s) 206 to take one or more actions. For example, the control module 256 may cause the example charged particle microscope system(s) 206 to cause the sample holder 204 to apply a translation, tilt, rotation, or a combination thereof. Additionally, the control module 256 may be executable to cause one or more deflectors in the focusing column 218 to cause the electron beam 212 to switch between a first mode in which the first portion 220 of sample 202 is irradiated and a second mode in which the second region 228 on the sample holder 204 (e.g., a region on a sample support component of the sample holder such as a mesh, foil, grids, etc.) is irradiated. Optionally, the control module 256 can be executable to control a beam blanker 230 to blanks the beam 212 during the time period where the particle microscope system(s) 206 to switch between the first mode and the second mode, thus preventing damage of the surface of the sample 202 caused by the electron beam traveling from the first location 220 to the second location 228 in the sample plane. The control module 256 may be further executable to cause the focusing column 216 to deflect the electron beam 212 such that other regions of interest on the sample 202 may be imaged. In such situations, the control module 256 may cause the particle microscope system(s) 206 to toggle from the first mode in which the other region of the interest on the sample 202 to be imaged, and a second mode in which the second region 228 (or another location proximate to the other region of interest) on the sample holder 204 is irradiated by the electron beam 212. In this way, the control module 256 can cause a series of regions of interest to be investigated on the sample while ensuring that any charging effect on the sample is greatly reduced or eliminated. In some embodiments, the control module 256 causes the plurality of regions of interest to be investigated according to a predetermined imaging pattern. This imaging pattern may be selected so that the regions that are imaged are not damaged by prior irradiation damage from deflecting the beam 212. For example, the beam may first image regions of interest near the edges of the sample (with the deflection occurring across a nearest edge of the sample to a proximate region of the sample holder), before imaging interior regions of the sample (with the deflection causing irradiation of previously imaged regions of interest near the edge of the sample).

The mode configuration module 256 can be executable by the processors 252 to select a frequency and/or the time the beam remains in the iteration of each mode. For example, the mode configuration module 256 may select the frequency and/or the time the beam remains in the iteration such that they are optimal for the sample type, the detector type, desired imaging characteristics, or a combination thereof. For example, the frequency may be selected based on a particular number of interactions occur before the first region 220 sustains substantial irradiation damage. Alternatively, or in addition, the time of irradiations may be selected such that enough electrons/emission 222 are generated for the microscope detector system 224 to create quality detector data while ensuring that the amount of charge built up during each individual irradiation of the first region 220 is not enough to substantially effect the quality or resolution of the detector data.

The image reconstruction module 260 is executable on the processors 252 to generate reconstructions of the region of interest of the sample 202 based on detector data from the microscope detector system 224. For example, the image reconstruction module 260 may generate grayscale images of the first region 220 on the sample based on detector data obtained by the microscope detector system 224 when the microscope system(s) 206 was operating in the first mode. In this way, the images generated by the image reconstruction module 260 are not effected by the blurring effects of sample charged buildup that presently limits the resolution of TEM investigation of insulative samples.

As discussed above, the computing devices 226 include one or more processors 252 configured to execute instructions, applications, or programs stored in a memory(s) 254 accessible to the one or more processors. In some examples, the one or more processors 252 may include hardware processors that include, without limitation, a hardware central processing unit (CPU), a graphics processing unit (GPU), and so on. While in many instances the techniques are described herein as being performed by the one or more processors 252, in some instances the techniques may be implemented by one or more hardware logic components, such as a field programmable gate array (FPGA), a complex programmable logic device (CPLD), an application specific integrated circuit (ASIC), a system-on-chip (SoC), or a combination thereof.

The memories 254 accessible to the one or more processors 252 are examples of computer-readable media. Computer-readable media may include two types of computer-readable media, namely computer storage media and communication media. Computer storage media may include volatile and non-volatile, removable, and non-removable media implemented in any method or technology for storage of information, such as computer readable instructions, data structures, program modules, or other data. Computer storage media includes, but is not limited to, random access memory (RAM), read-only memory (ROM), erasable programmable read only memory (EEPROM), flash memory or other memory technology, compact disc read-only memory (CD-ROM), digital versatile disk (DVD), or other optical storage, magnetic cassettes, magnetic tape, magnetic disk storage or other magnetic storage devices, or any other non-transmission medium that may be used to store the desired information and which may be accessed by a computing device. In general, computer storage media may include computer executable instructions that, when executed by one or more processing units, cause various functions and/or operations described herein to be performed. In contrast, communication media embodies computer-readable instructions, data structures, program modules, or other data in a modulated data signal, such as a carrier wave, or other transmission mechanism. As defined herein, computer storage media does not include communication media.

Those skilled in the art will also appreciate that items or portions thereof may be transferred between memory 254 and other storage devices for purposes of memory management and data integrity. Alternatively, in other implementations, some or all of the software components may execute in memory on another device and communicate with the computing devices 226. Some or all of the system components or data structures may also be stored (e.g., as instructions or structured data) on a non-transitory, computer accessible medium or a portable article to be read by an appropriate drive, various examples of which are described above. In some implementations, instructions stored on a computer-accessible medium separate from the computing devices 226 may be transmitted to the computing devices 226 via transmission media or signals such as electrical, electromagnetic, or digital signals, conveyed via a communication medium such as a wireless link. Various implementations may further include receiving, sending or storing instructions and/or data implemented in accordance with the foregoing description upon a computer-accessible medium.

FIGS. 3 and 4 are diagrams that illustrate a top down view 300 and side view 400 of a TEM investigation of a sample 308 where the buildup of charge during the investigation is reduced by deflecting the imaging beam between a first location 310 on a sample 308 and a second location 312 on the sample holder 314. Specifically, FIG. 3 is a collection of top down images that illustrate a process for switching between a first mode and a second mode during a TEM investigation to reduce and/or eliminate the effects of sample charge buildup.

Image 302 shows a top down view the sample 308 being held by a sample holder 314 and being irradiated with a charged particle beam by a microscopy system operating in a first mode. In the first mode, the charged particle beam is used to irradiate a region of interest 310 on the sample. While the charged particle beam irradiates the region of interest 310, the net emission of electrons causes a positive charge to develop on the sample 310 in and around the region of interest 310. Image 304 shows a top down view the sample 308 being held by the sample holder 314 after the beam has undergone a deflection 316 such that the microscopy system operates in a second mode. In the second mode, the charged particle beam irradiates a second region 318 on the sample holder 314. While the charged particle beam irradiates the second region 318, this region is caused to emit electrons that at least partially migrate to in and around the region of interest 310 such that the positive charge to develop on the sample 310 in and around the region of interest 310 is negated. Image 304 also shows the irradiation damage 320 that has been caused during the irradiation of the region of interest 310 when the system operates in the first mode. In the system depicted in image 304 the beam is blanked between the first and second mode such that the beam does not cause any irradiation damage to the sample surface between the region of interest 310 and the second region 318. If the system did not perform such a blanking, the beam would cause additional irradiation damage on the surface of the sample 308 as the beam traversed from the region of interest 310 to the second region 318.

Image 306 shows a top down view the sample 308 being held by the sample holder 314 after the beam has undergone a second deflection 322 such that the microscopy system operates in the first mode again. In addition to showing the region of interest 310 being irradiated, Image 306 also shows the irradiation damage 324 that has been caused during the irradiation of the second region 318 when the system operates in the second mode. The system may then cause additional deflections to further toggle between the first mode and the second mode until sufficient detector data is obtained to generate a high resolution image of the region of interest.

FIG. 4 is a collection of side view images that illustrate a process for switching between a first mode and a second mode during a TEM investigation to reduce and/or eliminate the effects of sample charge buildup. Image 402 shows a side view image of a sample 308 being held by a sample holder 314 and being irradiated with a charged particle beam 408 by a microscopy system operating in a first mode. In the first mode, the charged particle beam 408 is used to irradiate a region of interest 310 on the sample. Image 304 shows the sample 308 being held by the sample holder 314 after the beam 408 has undergone a deflection such that the microscopy system operates in a second mode. In the second mode, the charged particle beam 408 irradiates a second region 318 on the sample holder 314. Image 406 shows a side view image of the sample 308 being held by the sample holder 314 after the beam 408 has undergone a second deflection 322 such that the microscopy system operates in the first mode again.

Figure 5:
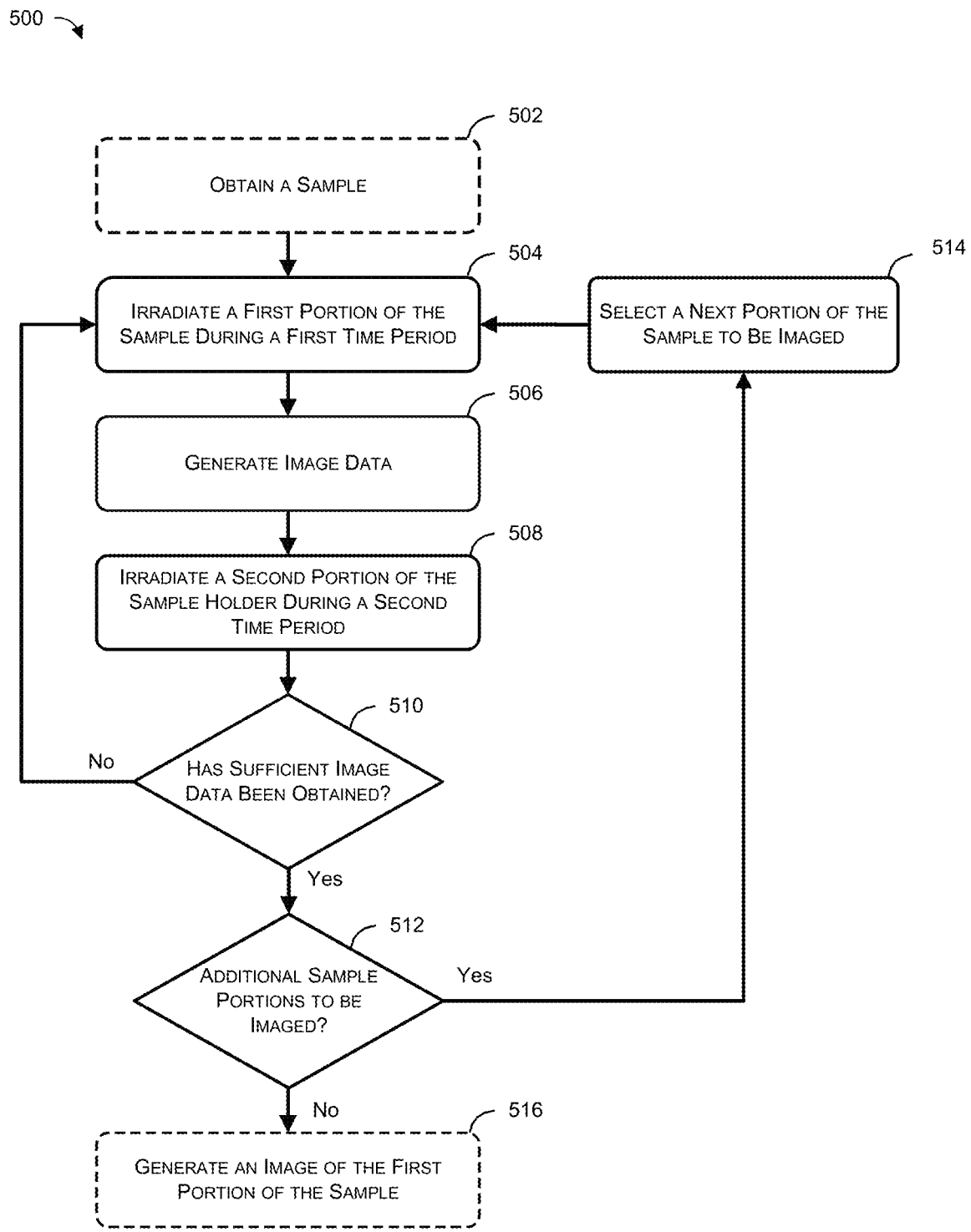
FIG. 5 is a flow diagram of an illustrative process for reducing the buildup of charge during the investigation of samples by deflecting the imaging beam between a first location on a sample and a second location on the sample holder.
Figure 7:
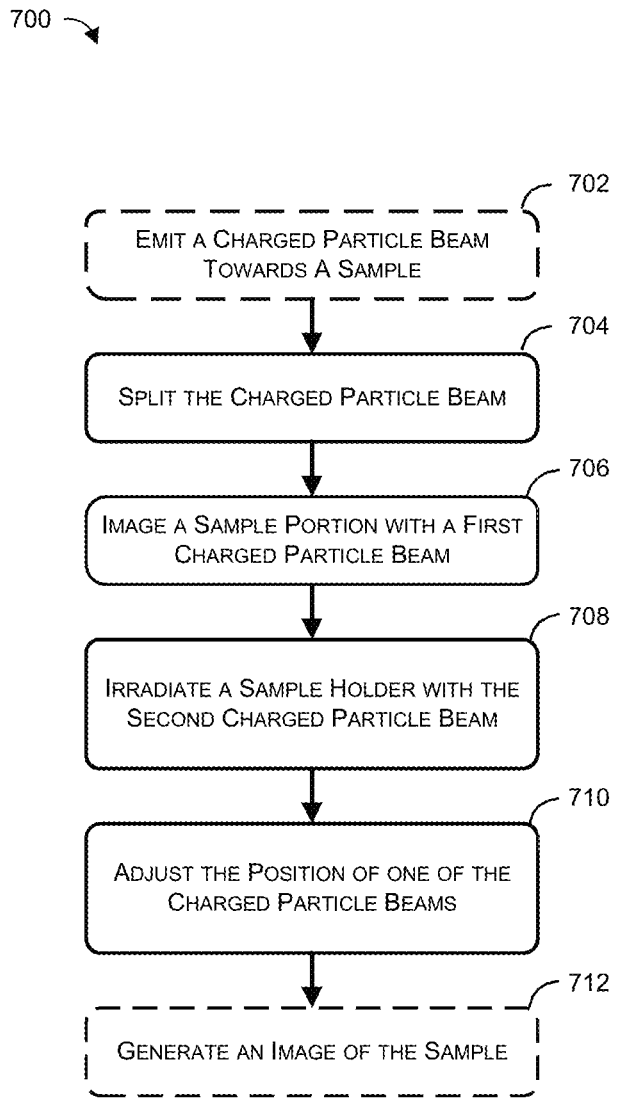
FIG. 7 is a flow diagram of an illustrative process for reducing the buildup of charge during the investigation of samples by simultaneously irradiating a first location on a sample and a second location on the sample holder using a first beam and a second beam that can be independently translated.

FIGS. 5 and 7 are flow diagrams of illustrative processes depicted as a collection of blocks in a logical flow graph, which represent a sequence of operations that can be implemented in hardware, software, or a combination thereof. In the context of software, the blocks represent computer-executable instructions stored on one or more computer-readable storage media that, when executed by one or more processors, perform the recited operations. Generally, computer-executable instructions include routines, programs, objects, components, data structures, and the like that perform particular functions or implement particular abstract data types. The order in which the operations are described is not intended to be construed as a limitation, and any number of the described blocks can be combined in any order and/or in parallel to implement the processes.

Specifically, FIG. 5 is a flow diagram of an illustrative process 500 for reducing the buildup of charge during the investigation of samples by deflecting the imaging beam between a first location on a sample and a second location on the sample holder. The process 200 may be implemented in environment 200 and/or by one or more computing device(s) 226, and/or by the computing architecture 250, and/or in other environments and computing devices.

At 502, a sample is obtained in a TEM system. The sample may comprise an insulating material/composition such that electrons are not able to freely move across the surface of the sample to neutralize charge deposits. For example, the sample may correspond to a biological sample suspended in amorphous ice, where because electrons cannot easily redistribute among the ice, a net positive charge is built up when a portion of the sample/ice is irradiated with an electron beam.

At 504, a first portion of the sample is irradiated during a first time period by a TEM system operating in a first mode. Specifically, when the TEM system operates in the first mode an electron beam is directed such that it irradiates and/or passed through the first portion of the sample. However, as the sample is irradiated a charge is build up at and around the surface of the first portion of the sample such that electromagnetic fields are formed that interfere with the paths of electrons/emissions near the first portion of the sample. This reduced the resolution and/or quality of image data generated based on these electrons/emissions.

At 506, imaging data is generated for the first portion of the sample. Specifically, one or more detectors of the TEM system detect emissions of the sample that were resultant from the sample being irradiated by the electron beam. That is, a portion of the electrons passing through sample and/or emissions caused by the electron beam impinge on the one or more detectors. The one or more detectors are then configured to generate image data that describes the detection events for these emissions.

At 508, a second portion of a sample holder is irradiated for a second time period investigated by the TEM system operates in a second mode. Specifically, a deflection is applied to the electron beam such that it moves in the sample plane from irradiating the first portion of the sample to irradiating the second portion of a sample holder that is holding the sample (e.g., a region of a mesh, foil, or grid, configured to contain or otherwise support the sample). Because the sample holder may be made of a conductive material, the irradiation of the second portion does not cause a buildup of positive charge since electrons are able to redistribute to compensate for the electrons/emissions caused by the irradiation. Moreover, because the electrons/emissions caused by the irradiation are emitted proximate to the first portion of the sample, at least some of these electrons/emissions are pulled to the first location by the buildup of positive charge. In this way, at least a portion of the electrons/emissions caused by the irradiation of the second portion of the sample holder move to the first portion of the sample to compensate for the buildup of charge that occurs during step 504. In some embodiments, the electron beam is blanked during the time period where the TEM system to switch between the first mode and the second mode, thus preventing damage of the surface of the sample caused by the electron beam traveling from the first portion to the second portion in the sample plane.

At 510, it is determined whether sufficient imaging data has been obtained. For example, sufficient imaging data may have been obtained when a predetermined number of cycles between the first mode and the second mode occurs, enough image data has been obtained to generate an image of a desired resolution/quality, a certain time period has elapsed, the damage to the surface of the first portion of the sample has exceeded a threshold, or a combination thereof. If the answer at 510 is no, the process continues to step 504, and the first portion of the sample is again irradiated by the TEM system operating in a first mode.

Alternatively, if the answer at 510 is yes, the process continues to step 512, and it is determined whether additional portions of the sample are to be imaged. If the answer at 512 is yes, then the process continues at step 514 and a next portion of the sample to be imaged is selected. Whether additional portions of the sample are to be imaged and/or the selection of the next portion to be imaged may be determined based on a sample mapping, a user selection/input, a feature identification algorithm, an imaging pattern, or a combination thereof. For example, an imaging pattern may indicate a series of locations on the sample that are to be imaged in order. The imaging pattern may also include one or more locations on the sample holder that are to be irradiated when the TEM system operates in the second mode for each corresponding location on the sample. The imaging pattern may be such that the order of imaging ensures that locations are not prematurely damaged by the deflection of the electron beam when the TEM system switches between the first and second mode.

If the answer at 512 is no, the process optionally continues to step 516, and images of the sample are generated. That is, reconstructions of the portions of the sample irradiated when the TEM system operates in the first mode may be produced based on image data generated in step 506. Because the TEM system toggled between the first mode and the second mode during capture of this image data, no buildup of charge on the sample occurred, greatly reducing/and or eliminating the blurring effect of sample charging in the reconstructions.

Figure 6:
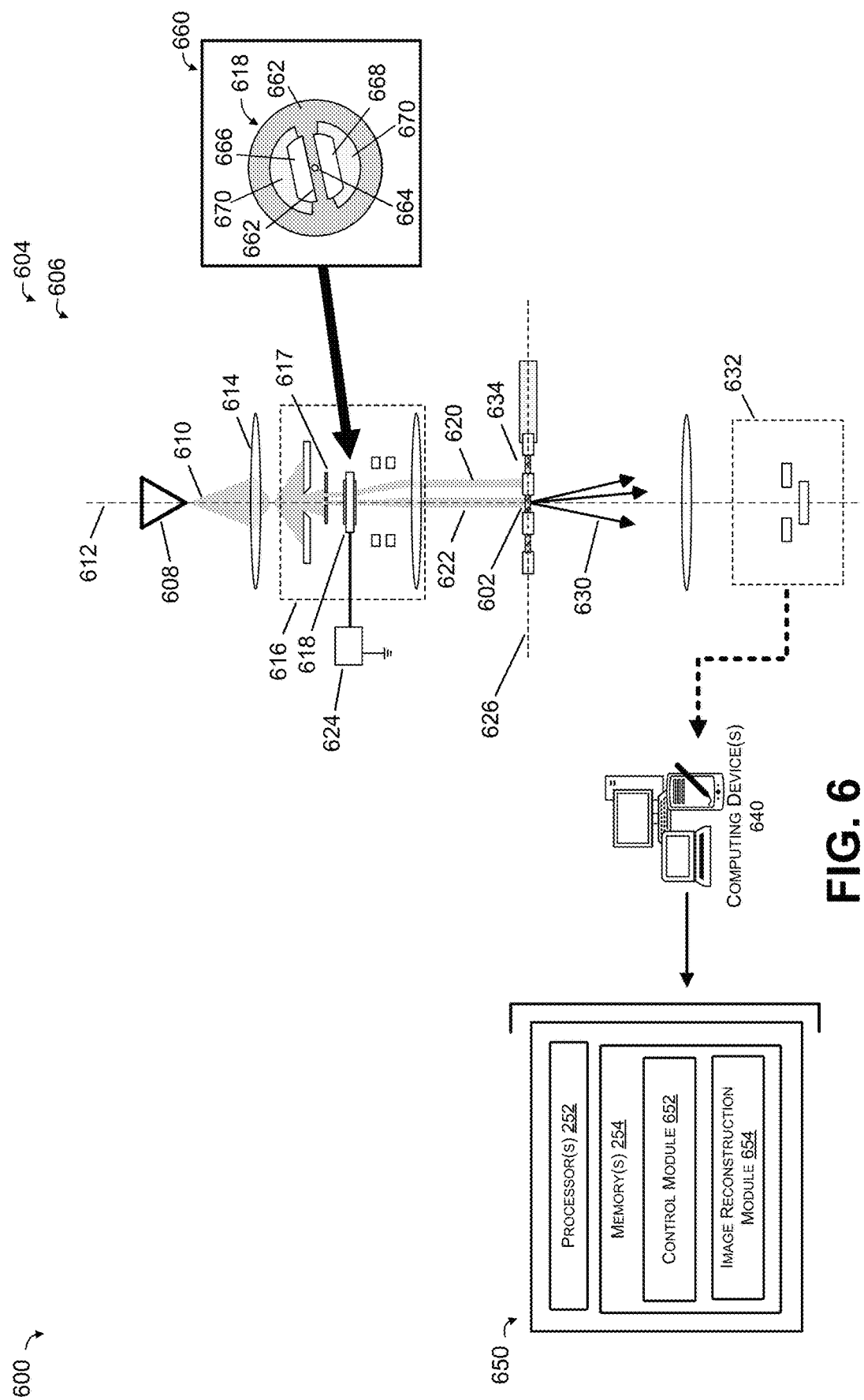
FIG. 6 is an illustration of an example environment for reducing the buildup of charge during the investigation of samples by using an independently translatable second beam.

FIG. 6 is an illustration of example environment 600 for reducing the buildup of charge during the investigation of samples by using an independently translatable second beam. Specifically, FIG. 6 shows example environment 600 as including example charged particle system(s) 604 for investigation and/or analysis of a sample 602. The example charged particle system(s) 604 may be or include one or more different types of optical, and/or charged particle microscopes, such as, but not limited to, a scanning transmission electron microscope (STEM), a transmission electron microscope (TEM), a charged particle microscope (CPM), a cryo-compatible microscope, focused ion beam microscope (FIBs), dual beam microscopy system, or combinations thereof. FIG. 6 shows the example charged particle microscope system(s) 206 as being a transmission electron microscope (TEM) 606.

The example charged particle microscope system(s) 606 includes a charged particle source 608 that emits an electron beam 610 along an emission axis 612 and towards an accelerator lens 614. The emission axis 610 is a central axis that runs along the length of the example charged particle microscope system(s) 604 from the charged particle source 608 and through the sample 602. The accelerator lens 614 that accelerates/decelerates, focuses, and/or directs the electron beam 610 towards a focusing column 616. The focusing column 616 focuses the electron beam 610 so that it is incident on at least a portion of the sample 602. In some embodiments, the focusing column 616 may include one or more of an aperture, scan coils, and upper condenser lens. The focusing column may focus the electrons from electron source into a small spot on the sample (i.e., when the system operates as a SEM) and/or may focus the electrons so that it strikes the sample as a parallel beam (i.e., when the system operates as a TEM). Different locations of the sample 602 may be scanned by adjusting the electron beam direction via the scan coils. Additionally, the focusing column 616 may correct and/or tune aberrations (e.g., geometric aberrations, chromatic aberrations) of the electron beam 610.

FIG. 6 shows focusing column 616 as including an aperture device 617 configured to divide the charged particle beam 610 into at least a first beam 620 and a second beam 622 that each pass through a holey biprism 618 device. While aperture device 617 is shown as being separate from the holey biprism device 618, a person having skill in the art would understand that the two components could be combined into a single structure in some embodiments of the present invention.

FIG. 6 also shows an inset top down view 660 of the holey biprism device 618. The holey biprism 618 comprises an electrically conductive body 662 that is configured to partially define at least a first aperture 666 and a second aperture 668. When used in a charged particle microscopy system, the holey biprism 618 allows at least a portion of the first charged particle beam 620 to pass through one of the first aperture and second aperture. The body 662 further defines an inner aperture 664 that allows at least a portion of the second beam 622 to pass through the body 662 when used in the charged particle microscope system 604 (i.e., the second beam 622 may pass through inner aperture 664). The body 662 holey biprism 618 is shown in FIG. 6 as including a ring portion and a bar portion bisecting the ring portion. However, in other embodiments the body 662 of the holey biprism 618 may not include a ring portion. A power source 624 is electrically connected to the body 662 of the holey biprism that is configured to apply a voltage to the body 662 such that an electromagnetic field is generated that deflects the first charged particle beam 620 in a sample plane 626 while not affecting the position of the second charged particle beam 622 in the sample plane. The magnitude of the deflection in the sample plane is based on the voltage applied to the body. Inset 660 further shows a portion of a holding body 670 that partially defines the first and second apertures. According to the present invention, a voltage potential difference exists between the holding body 670 and the body 662 to allow the first charged particle beam 620 to be deflected. In some embodiments the holding body 670 is on earth potential. In this way, by adjusting the voltage applied to the body the first beam 620 can be translated in the sample plane independently and/or without affecting the second beam 622.

In some embodiments, the electrically conductive body of the holey biprisim device 618 is positioned within an outer aperture that is defined by a holding body, and splits the outer aperture into a first subaperture and a second subaperture. In such embodiments the portion of the first charged particle beam 620 is the portion of the charged particle beam 610 that passes through the first subaperture, and the portion of the charged particle beam 610 that passes through the second subaperture is a third charged particle beam. The holding body may be configured to allow the body to be rotated about the emission axis of the charged particle beam to cause a rotation of the first charged particle beam in the sample plane 626. The voltage applied to the body of the holey biprism 618 generates an electromagnetic field also deflects the third charged particle beam. The deflection of the third charged particle beam may be equal to the deflection to the first charged particle beam 620 and/or in an opposite direction. In this way, one of the first beam 620 or the second beam 622 can be used to image a sample 602 while the other beam is incident on the sample holder so as to compensate for charge buildup on the sample 602. Then, if a user switches to differently sized sample holder or wishes to image a different region of the sample, the first charged particle beam 620 can be moved by only adjusting the voltage to the holey biprism 618, instead of needing to reconfigure the optical column of the system 604.

During TEM imaging, one of the electron beams 620 or 622 is directed such that it irradiates and/or passed through a region of interest at a first location on the sample 602. A portion of the electrons 630 passing through sample 602 and/or emissions 630 caused by the electron beam 620 or 622 impinge on a microscope detector system 632. Additionally, the other beam of the electron beams can be used to irradiate a second location on the sample holder such that electrons/emission are induced that at least partially neutralize the sample charged buildup caused by the irradiation of the region of interest on the sample 602. In this way, electrons and/or emissions generated during irradiation of the first location are captured by the detector system 632 without their trajectories being altered by electromagnetic fields from sample charge buildup, which then generates detector data that can be used to create reconstruction of the region of interest of the sample 602 that lack the blurring effect currently caused by sample charging. In FIG. 6, the microscope detector system 632 is illustrated as including a disk-shaped bright field detector and dark field detector(s). In some embodiments, the microscope detector system 632 may include one or more other detectors. Alternatively, or in addition, the microscope detector system 632 may include a scanning electron microscope detector system, a focused ion beam detector system, a scanning electron microscope secondary electron detector system, a focused ion beam secondary electron detector system, and an optical microscope detector system.

FIG. 6 further illustrates the example charged particle microscope system(s) 206 as further including a sample holder 634 and computing device(s) 640. The sample holder 634 is configured to hold the sample 602, and is able to translate, rotate, and/or tilt the sample 602 in relation to the example charged particle microscope system(s) 604. FIG. 6 shows the sample holder 634 as comprising a conductive foil that defines apertures where a sample 602 can be held for TEM investigation. In cryo-TEM, the sample 602 may correspond to biological or other matter (e.g., proteins) suspended in amorphous ice located within the apertures defined by a conductive sample holder foil.

FIG. 6 further includes a schematic diagram illustrating an example computing architecture 650 of the computing devices 626. Example computing architecture 650 illustrates additional details of hardware and software components that can be used to implement the techniques described in the present disclosure. Persons having skill in the art would understand that the computing architecture 650 may be implemented in a single computing device 626 or may be implemented across multiple computing devices. For example, individual modules and/or data constructs depicted in computing architecture 650 may be executed by and/or stored on different computing devices 626. In this way, different process steps of the inventive method according to the present disclosure may be executed and/or performed by separate computing devices 626.

In the example computing architecture 650, the computing device includes one or more processors 252 and memory 254 communicatively coupled to the one or more processors 252. The example computing architecture 650 can include a control module 652 and an image reconstruction module 654 stored in the memory 254.

The control module 652 can be executable by the processors 252 to cause a computing device 640 and/or example charged particle microscope system(s) 604 to take one or more actions. For example, the control module 652 may cause the example charged particle microscope system(s) 604 to cause the sample holder 634 to apply a translation, tilt, rotation, or a combination thereof. Additionally, the control module 652 may be executable to apply and/or change the voltage applied to the body of the holey biprism 618 by the voltage source 620. In this way, the control module 652 may cause the first beam 620 to be translated in the sample plane 626 without moving the second beam 622.

The image reconstruction module 654 is executable on the processors 252 to generate reconstructions of the region of interest of the sample 602 based on detector data from the microscope detector system 632. For example, the image reconstruction module 654 may generate grayscale images of the first region on the sample based on detector data obtained by the microscope detector system 632 when the microscope system(s) 206 irradiated it with the second beam 622 while the first beam 620 irradiated a proximate portion of the sample holder 634. In this way, the images generated by the image reconstruction module 260 are not effected by the blurring effects of sample charged buildup that presently limits the resolution of TEM investigation of insulative samples.

FIG. 7 is a flow diagram of an illustrative process 700 for reducing the buildup of charge during the investigation of samples by simultaneously irradiating a first location on a sample and a second location on the sample holder using a first beam and a second beam that can be independently translated. The process 700 may be implemented in environment 600 and/or by one or more computing device(s) 640, and/or by the computing architecture 650, and/or in other environments and computing devices.

At 702, a charged particle beam is emitted towards a sample. For example, an electron source may emit an electron beam towards a sample being investigated by a TEM system. The sample may comprise an insulating material/composition such that electrons are not able to freely move across the surface of the sample to neutralize charge deposits.

At 704, the charged particle beam is split into a first beam and a second beam. For example, where the TEM system includes a holey biprism device, the body of the holey biprism at least partially blocks the charged particle beam such that a first beam is allowed to pass by the body, and an aperture defined by the body allows a second beam is allowed to pass through the body. In some embodiments, the body of the holey biprisim device is positioned within an outer aperture that is defined by a holding body such that the body splits the outer aperture into a first subaperture and a second subaperture. In such embodiments, the portion of the charged particle beam that passes through the first subaperture is the first beam and the portion of the charged particle beam that passes through the second subaperture is a third beam. One or both of the first beam and the third beam may be blanked downstream of the holey biprism device. The holding body may be configured to allow the body to be rotated about the emission axis of the charged particle beam to cause a rotation of the first charged particle beam in the sample plane. A voltage applied to the body of the holey biprism generates an electromagnetic field that deflects the third beam and/or the first beam such that its/their position in the sample plane is affected. Because the second beam passes through the body of the holey biprism, the voltage applied to the body does not deflect or otherwise affect the position of the second beam in the sample plane.

At 706, a first portion of the sample is irradiated by the second beam. Specifically, the optical column of the TEM system operates to focus and/or direct the second beam onto a region of interest on the sample such that the second beam irradiates and/or passed through the first portion of the sample. Imaging data is generated for the region of interest on the sample by one or more detectors of the TEM system based on a detected portion of the electrons passing through sample and/or emissions caused by the electron beam impinging on the one or more detectors. However, as the sample is irradiated a charge is built up at and around region of interest of the sample such that electromagnetic fields are formed that interfere with the paths of electrons/emissions near the sample. This reduced the resolution and/or quality of image data generated based on these electrons/emissions.

At 708, a proximate portion of the sample holder is irradiated with the first beam. Because the sample holder may be made of a conductive material, the irradiation of the sample holder does not cause a buildup of positive charge since electrons are able to redistribute to compensate for the electrons/emissions caused by the irradiation. Moreover, because the electrons/emissions caused by the irradiation are emitted proximate to the region of interest on the sample, at least some of these electrons/emissions are pulled to the sample to neutralize the buildup of positive charge. In this way, at least a portion of the electrons/emissions caused by the irradiation of the sample holder move to the sample to compensate for the buildup of charge that occurs during step 706.

At 710, the position of one of the charged particle beam is independently adjusted in the sample plane. For example, a power source electrically connected to the body of the holey biprism may adjust the voltage applied to the body of the holey biprism such that the electromagnetic field generated changes, resulting in a deflection/repositioning of the first beam (a third beam if present) in the sample plane. In this way, the first beam can be repositioned in the sample plane without affecting the position of the second beam in the sample plane. Thus, if a user switches to a differently sized sample holder or wishes to image a different region of the sample, the first beam can be moved by only adjusting the voltage to the holey biprism, instead of needing to reconfigure the optical column of the TEM system.

A 712, an image of the sample is generated. That is, reconstructions of the portions of the sample based on image data generated in step 706. Because the TEM system simultaneously irradiated both the sample and a proximate portion of the sample holder during capture of this image data, no buildup of charge on the sample occurred, greatly reducing/ and or eliminating the blurring effect of sample charging in the reconstructions.

Figure 8:
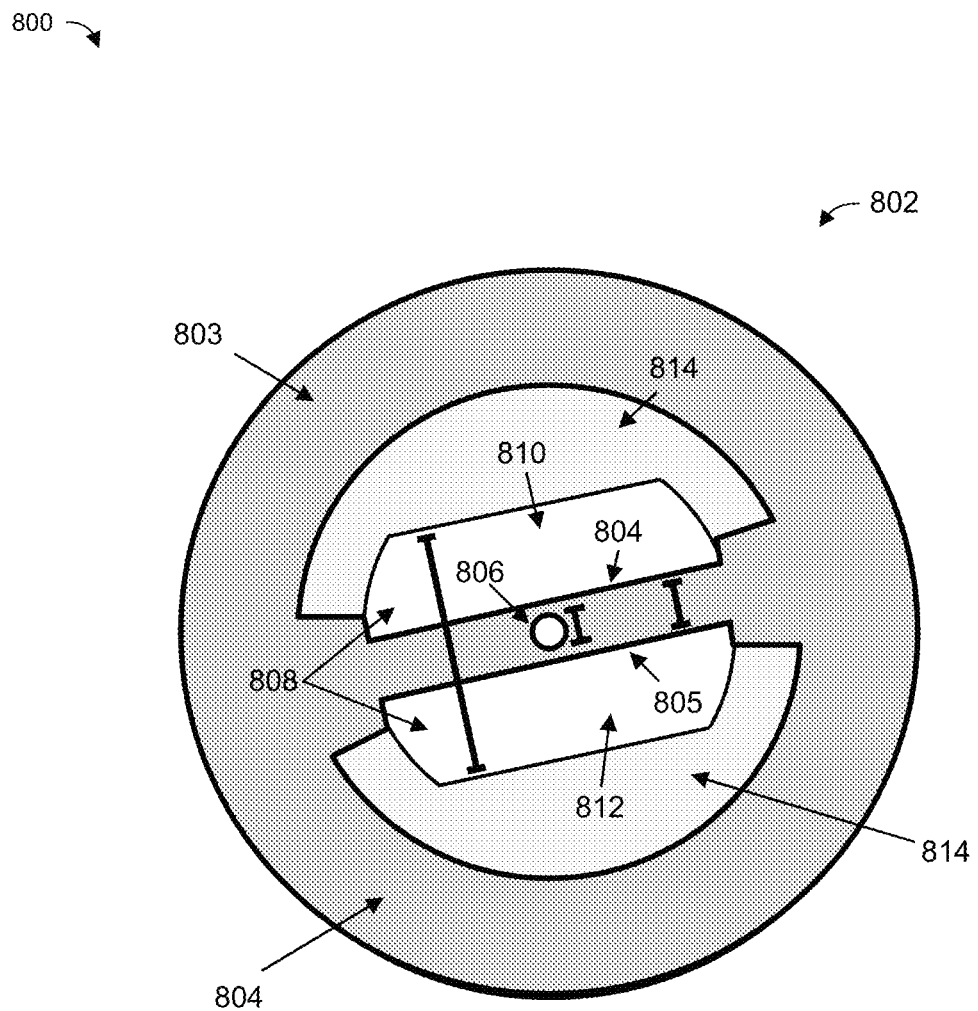
FIG. 8 is a schematic illustration of an example holey biprism according to the present disclosure.

FIG. 8 is a schematic illustration 800 of an example holey biprism 802 according to the present disclosure. The holey biprism 802 comprises a conductive body 804 that defines an inner aperture 806 that allows a first beam to pass through the body 804 during use of the holey biprism 802. The body 804 of holey biprism 802 is shown as including a ring portion 803 and a bar portion 805 bisecting the ring portion. In some such embodiments, the ring portion 805 may be connected to a holding body 814 to allow for the holey biprism 802 to be rotated (e.g., via gears) within a charged particle system about an emission path of a charged particle beam passing through the inner aperture 806. However, in other embodiments the body 804 of the holey biprism 802 may not include a ring portion. In FIG. 8 the body 802 is shown as being positioned such that it partially obstructs an outer aperture 808 such that it partially creates a first subaperture 810 that allows a second beam to pass through the outer aperture and a second subaperture 812 that may allow a third beam to pass through the outer aperture. FIG. 8 further shows a portion of a holding body 814 that partially defines the first and second apertures. In some embodiments the holding body 814 is on earth potential.

Figure 9:
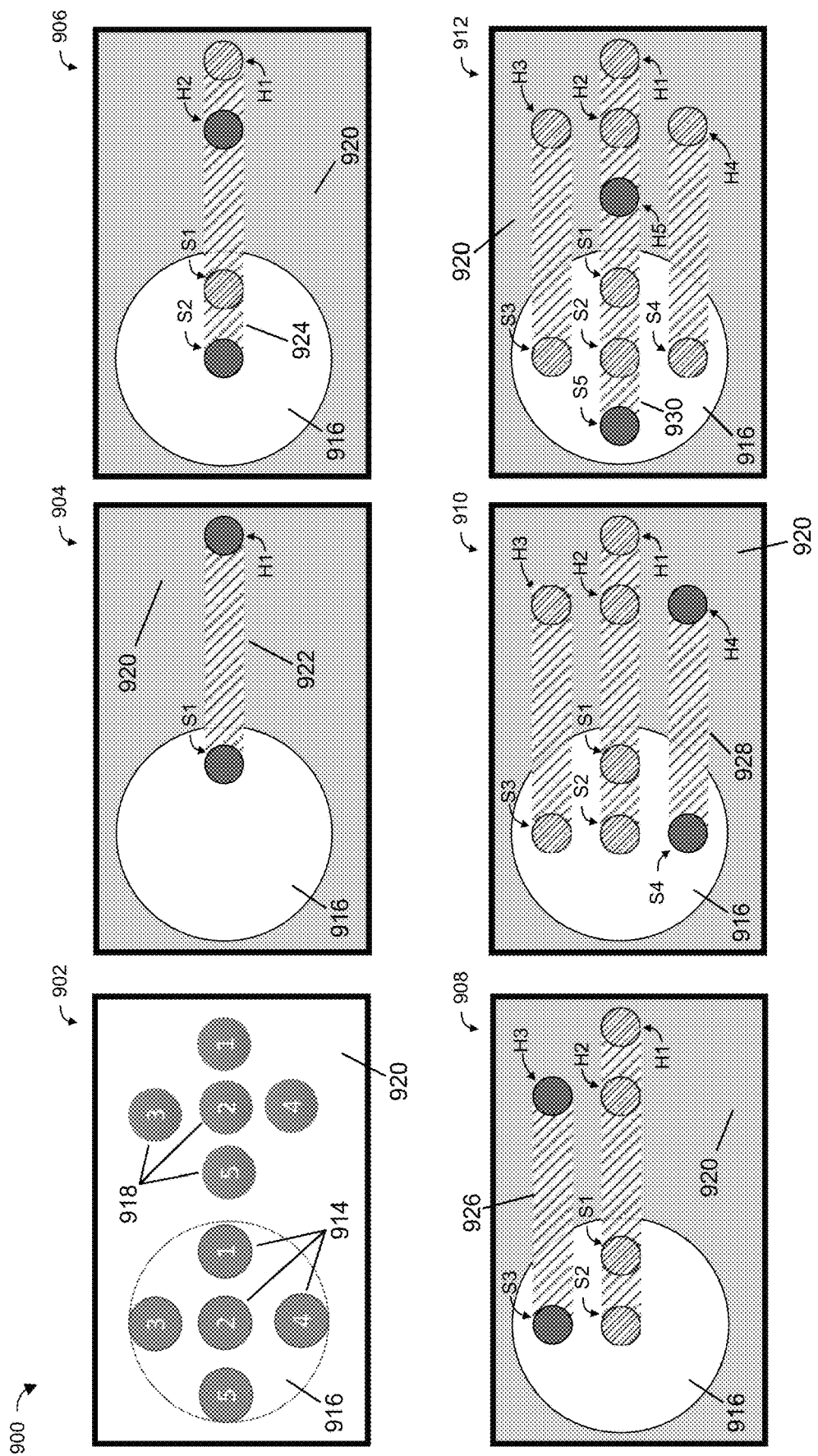
FIGS. 9 and 10 are visual flow diagrams that illustrate an example process for imaging multiple locations on a sample using sample charge reduction techniques according to the present disclosure.
Figure 10:
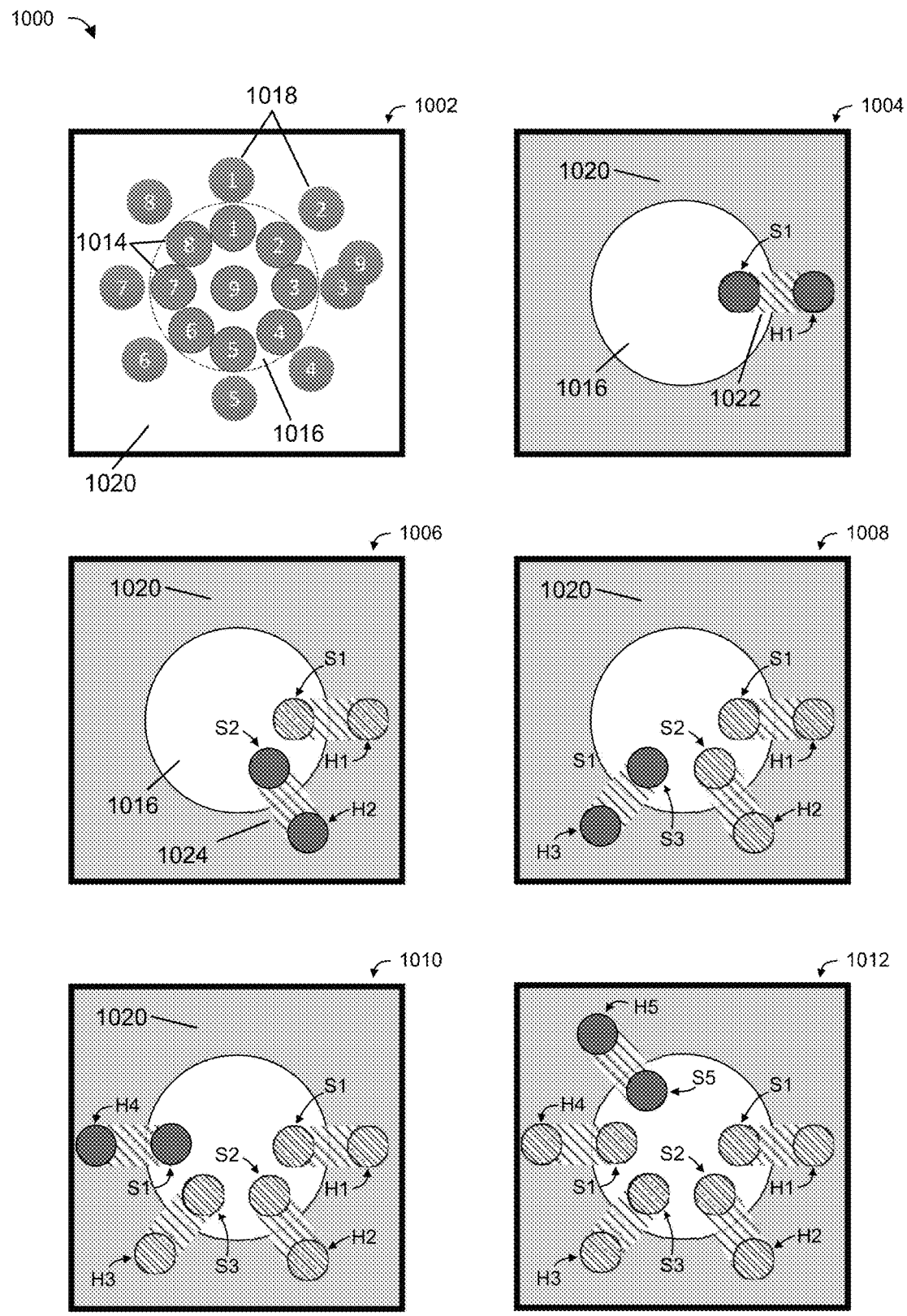

FIGS. 9 and 10 are visual flow diagrams that illustrate an example process 300 for imaging multiple locations on a sample using sample charge reduction techniques according to the present disclosure. Specifically, FIG. 9 is a visual flow diagram of a process 900 for imaging multiple locations on a sample using sample charge reduction with deflections along a single axis. The process 900 may be implemented in environments 100 or 600 and/or by one or more computing device(s) 226 or 640, and/or by the computing architecture 250 or 650, and/or in other environments and computing devices.

Image 902 shows a pattern mapping for imaging multiple locations 914 on a sample using sample 916 charge reduction with deflections along a single axis. The pattern mapping further shows a plurality of corresponding locations 918 on the sample holder 920. Each of the locations 914 on the sample has a corresponding location 918 on the sample holder. When the TEM imaging system operates in a first mode the electron beam irradiates one of the multiple locations 914, and when the TEM imaging system operates in a second mode the electron beam irradiates a corresponding location 918. The mapping also shows an order in which the regions of the sample 914 are to be imaged so as to prevent irradiation damage to the regions 914 before they are imaged.

Image 904 illustrates how the TEM system images the first location S1 according to the present disclosure. Specifically, when operating in a first mode the electron beam irradiates the first location S1 on the sample 916 for a first time period, after which the beam is deflected so that it irradiates the corresponding location H1 on the sample holder. After the corresponding location H1 has been irradiated for a second time period, after which the electron beam receives another deflection that causes it to irradiate the first location S1 on the sample. This process is iterated until a sufficient amount of imaging data for the first location S1 is obtained. Image 904 also shows the irradiation damage 922 caused when the electron beam deflects between the first location S1 and the corresponding location H1.

Image 906 illustrates how the TEM system images the second location S2 according to the present disclosure, after imaging of the first location S1 is complete. When operating in a first mode the electron beam irradiates the second location S2 on the sample 916 for a first time period, after which the beam is deflected so that it irradiates the corresponding location H2 on the sample holder. After the corresponding location H2 has been irradiated for a second time period, after which the electron beam receives another deflection that causes it to irradiate the second location S2 on the sample. This process is iterated until a sufficient amount of imaging data for the second location S2 is obtained. Image 904 also shows how the path of irradiation damage 924 caused when the electron beam deflects between the second location S2 and the corresponding location H2 includes the first location S1. Because the first location S1 is imaged before the second location S2, it is irrelevant that the imaging shown in image 906 damages the first location S1.

Images 908, 910, and 912 illustrate how the TEM system images the third, fourth, and fifth locations S3, S4, S5 on the sample 916, respectively. This images also show how the pattern mapping results in the regions of irradiation damage caused by iterating between the first and second mode for each location do not affect the integrity of subsequently imaged locations on the sample.

FIG. 10 is a visual flow diagram of a process 1000 for imaging multiple locations on a sample using sample charge reduction with deflections along multiple axis. The process 1000 may be implemented in environments 100 or 600 and/or by one or more computing device(s) 226 or 640, and/or by the computing architecture 250 or 650, and/or in other environments and computing devices.

Image 1002 shows a pattern mapping for imaging multiple locations 1014 on a sample using sample 1016 charge reduction with deflections across a proximate sample edge. The pattern mapping further shows a plurality of corresponding locations 1018 on the sample holder 1020 for each of the multiple locations 1014. When the TEM imaging system operates in a first mode the electron beam irradiates one of the multiple locations 1004, and when the TEM imaging system operates in a second mode the electron beam irradiates a corresponding location 1018. The mapping also shows an order in which the regions of the sample 1014 are to be imaged so as to prevent irradiation damage to the regions 1014 before they are imaged.

Image 1004 illustrates how the TEM system images the first location S1 according to the present disclosure. Specifically, when operating in a first mode the electron beam irradiates the first location S1 on the sample 1016 for a first time period, after which the beam is deflected so that it irradiates the corresponding location H1 on the sample holder. After the corresponding location H1 has been irradiated for a second time period, after which the electron beam receives another deflection that causes it to irradiate the first location S1 on the sample. This process is iterated until a sufficient amount of imaging data for the first location S1 is obtained. Image 1004 also shows the irradiation damage 1022 caused when the electron beam deflects between the first location S1 and the corresponding location H1.

Image 1006 illustrates how the TEM system images the second location S2 according to the present disclosure, after imaging of the first location S1 is complete. When operating in a first mode the electron beam irradiates the second location S2 on the sample 1016 for a first time period, after which the beam is deflected so that it irradiates the corresponding location H2 on the sample holder. After the corresponding location H2 has been irradiated for a second time period, after which the electron beam receives another deflection that causes it to irradiate the second location S2 on the sample. Image 1004 also shows the path of irradiation damage 1024 caused when the electron beam deflects between the second location S2 and the corresponding location H2.

Images 1008, 1010, and 1012 illustrate how the TEM system images the third, fourth, and fifth locations S3, S4, S5 on the sample 1016, respectively. These images also show how the pattern mapping results in the regions of irradiation damage caused by iterating between the first and second mode for each location do not affect the integrity of subsequently imaged locations on the sample. Additionally, by starting with the investigation of locations 104 proximate to the edge of the sample 1016, when inner locations are investigated later, it is irrelevant that the irradiation damage caused when the electron beam deflects to a correspond location on the sample holder crosses one of the location proximate to the edge of the sample as these locations have previously been imaged.

Figure 11:
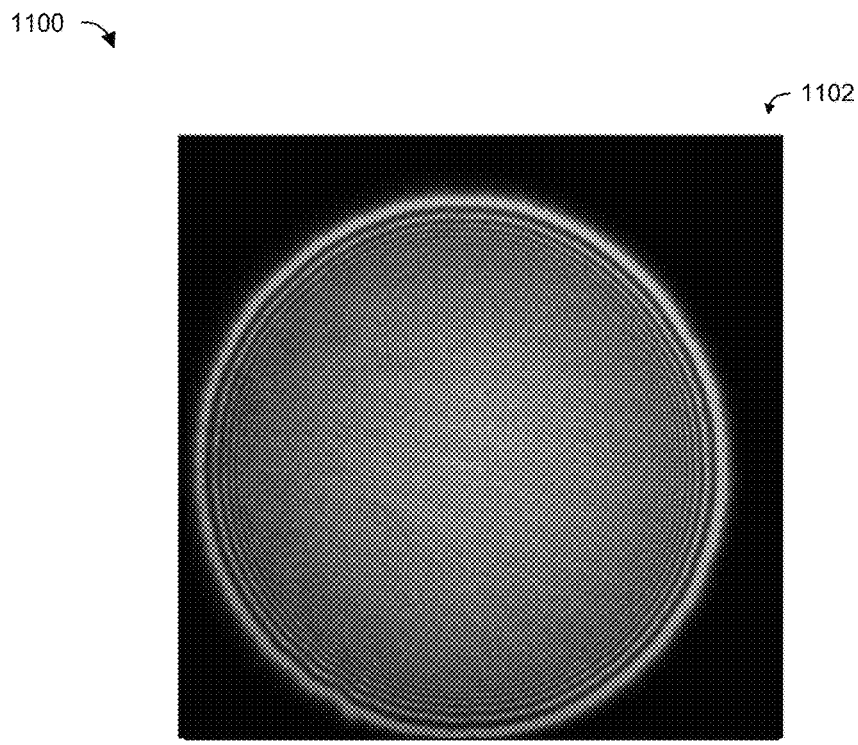
FIGS. 11 and 12 are images acquired using TEM investigations of proteins suspended in amorphous ice using prior art techniques, and sample charge reduction techniques according to the present disclosure, respectively.
Figure 12:
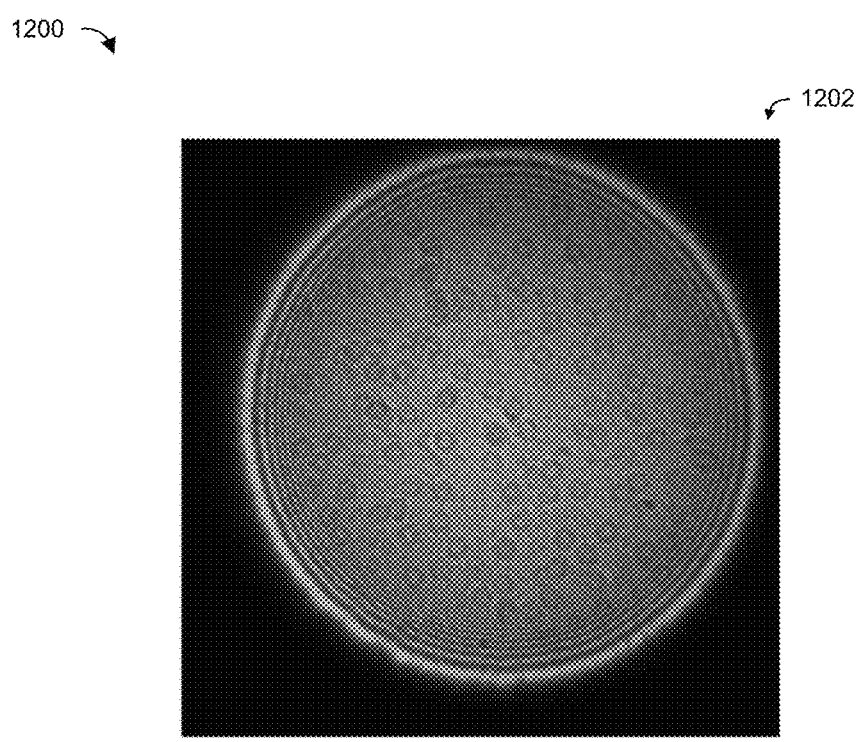

FIGS. 11 and 12 are images acquired using TEM investigations of proteins suspended in amorphous ice using prior art techniques 1102, and sample charge reduction techniques according to the present disclosure 1202, respectively. As can be seen, the image 1102 acquired with prior art techniques lacks clarity due to the blurring effect of the sample charge built up on the amorphous ice during TEM imaging. On the contrary, because the techniques described herein compensate for charge buildup during the capturing of the image, the image 1202 have increased resolution over image 1102.

Examples of inventive subject matter according to the present disclosure are described in the following enumerated paragraphs.

A1. A method for evaluating a sample with reduced sample charging, the method including: irradiating a first portion of a sample during a first time period, wherein the irradiating the first portion of the sample causes a gradual deposit of charge in the first portion of the sample; generating, with a detector system, imaging data based on emissions resultant from irradiating the first portion of the sample; irradiating a second portion of a sample holder for a second time period, wherein the irradiating the second portion of the sample holder causes secondary electrons to be released to compensate the deposit of charge; and iteratively repeating the irradiation of the first portion and the second portion during imaging of the sample region.

A1.1. The method of paragraph A1, wherein the irradiating the first portion of the sample causes a release of secondary electrons that results in a net loss of electrons in the first region of the sample.

A1.1.1. The method of paragraph A1, wherein the irradiating the first portion of the sample causes a release of secondary electrons that at least partially become deposited in the second portion of the sample holder that results in a net gain of electrons in the second region of the sample.

A1.1.2. The method of any of paragraphs A1.1-A1.1.1, wherein the deposit of charge causes a non-uniform blur of images generated from the imaging data.

A2. The method of any of paragraphs A1-A1.1, wherein the first time period is different from the second time period.

A2.1. The method of paragraph A2, wherein the first time period is of the same duration as the second time period.

A2.2. The method of paragraph A2, wherein the first time period is of a different duration as the second time period.

A2.3. The method of any of paragraphs A2-2.2, wherein the second time period occurs after the first time period.

A2.4. The method of any of paragraphs A2-A2.3, wherein the second time period is determined sufficient to have the second region release sufficient electrons such that it negates the net charge built up during the first timer period.

A3. The method of paragraph A2.3, wherein irradiating a first portion of a sample and irradiating a first portion of a sample comprises irradiating with a charged particle beam.

A3.1. The method of paragraph A3, wherein the charged particle beam is an electron beam.

A3.2. The method of paragraph A4, wherein the charged particle beam is an ion beam.

A4. The method of any of paragraphs A1-A3.2, where in iteratively repeating the irradiation of the first portion and the second portion during imaging of the sample region comprises:

irradiating the first portion of the sample during a third time period, wherein the irradiating the first portion of the sample causes a gradual deposit of charge in the first portion of the sample;

generating, with the detector system, additional imaging data based on emissions resultant from irradiating the first portion of the sample during the third time period; and irradiating the second portion of the sample holder for a fourth time period, wherein the irradiating the second portion of the sample holder during the fourth time period causes secondary electrons to be released to compensate the deposit of charge.

A5. The method of any of paragraphs A1-A4, further comprising blanking the charged particle beam between the first time period and the second time period to reduce irradiation damage in the region of the sample between the first portion and the second portion.

A6. The method of any of paragraphs A1-A5, further comprising deflecting the charged particle beam such that the region being irradiated by the charged particle beam changes from the first portion to the second portion.

A6.1. The method of paragraph A6, wherein the deflecting the charged particle beam results in the charged particle beam causing irradiation damage to region of the sample between the first portion and the second portion A6.2. The method of any of paragraphs A6-A6.1, wherein deflecting the charged particle beam comprises deflecting the charged particle beam along one axis of deflection.

A6.2.1. The method of paragraph A6.2, wherein deflecting the charged particle beam further comprises deflecting the charged particle beam along an additional axis of deflection.

A6.3. The method of any of paragraphs A6-A6.2.1, wherein deflecting the charged particle beam further comprises deflecting the beam to a nearby region according to a predetermined pattern.

A6.4. The method of any of paragraphs A6-A6.3, wherein deflecting the charged particle beam further comprises translating the charged particle beam directionally toward a closest electrically conductive area to the first portion of the sample.

A6.5. The method of any of paragraphs A6-A6.4, wherein deflecting the charged particle beam further comprises translating the charged particle beam towards the closest edge of the sample.

A7. The method of any of paragraphs A1-A3.2 and A5-6.5, further comprising: irradiating a third portion of the sample during a third time period, wherein the third portion is different form the first portion of the sample and the irradiating the third portion of the sample causes a gradual deposit of charge in the third portion of the sample; generating, with the detector system, additional imaging data based on emissions resultant from irradiating the third portion of the sample during the third time period; and irradiating a fourth portion of the sample holder for a fourth time period, wherein the irradiating the fourth portion of the sample holder during the fourth time period causes secondary electrons to be released to compensate the deposit of charge.

A7.1. The method of paragraph A7, wherein the fourth portion of the sample holder is the same as the second portion of the sample holder.

A7.2. The method of paragraph A7, wherein the fourth portion of the sample holder is the different from the second portion of the sample holder A7.3. The method of any of paragraphs A7-7.2, further comprising deflecting the charged particle beam such that the region being irradiated by the charged particle beam changes from the first portion to the second portion.

A7.3.1. The method of paragraph A7.3, wherein the deflecting the charged particle beam results in the charged particle beam causing irradiation damage to region of the sample between the first portion and the second portion.

A7.3.2. The method of any of paragraphs A7-7.3.1, wherein the new region of the sample is at least partially the same as the old region of the sample A7.3.3. The method of any of paragraphs A7-7.3.2, wherein the new region at least partially includes the first portion of the sample.

A8. The method of any of paragraphs A7-A7.3.3, wherein the method comprises continuing to image additional portions of the sample by iteratively irradiating a region of interest on the sample and a corresponding portion of the sample holder.

A8.1. The method of paragraph A8, wherein the continuing to image additional portions of the sample comprises determining the order of regions of interest and associated portions of the sample holder based on a predetermined pattern mapping.

A8.2. The method of any of paragraphs A8-A8.1, wherein the pattern mapping is configured such that each portion of the sample that is imaged has not been previously damaged by prior irradiations.

A9. The method of any of paragraphs A1-A8.2, wherein the first time period and the second period are determined based on a charging rate of the sample.

A10. The method of any of paragraphs A1-A9, wherein the first time period and the second period are determined based on the capture rate of the detector system.

A11. The method of any of paragraphs A1-A10, wherein the sample is an insulative material.

A11.1. The method of paragraph A11, wherein the sample is a biological sample.

A11.2. The method of any of paragraphs A11-A11.1, wherein the sample is amorphous.

A11.3. The method of any of paragraphs A1-A11.2, wherein the sample is cryogenic sample.

A11.4. The method of any of paragraphs A1-A11.3, wherein the sample is suspended in ice.

A11.5. The method of any of paragraphs A1-A11.4, wherein the sample comprises proteins suspended in amorphous ice.

A12. The method of any of paragraphs A1-A11.5, wherein the sample holder is electrically conductive.

A12.1. The method of paragraph A12, wherein the sample holder comprises a plurality of sample regions that allow TEM investigation of the corresponding samples.

A12.2. The method of any of paragraphs A12-A12.1, wherein the sample holder is a conductive foil that supports the plurality of sample regions.

A12.3. The method of any of paragraphs A12-A12.2, wherein the sample holder is a cryogenic sample holder for TEM samples.

B1. A method for evaluating a sample with reduced sample charging, the method including: irradiating a first portion of a sample with a first charged particle beam, wherein the irradiation of the first portion causes a release secondary electrons resulting in a buildup of charge in the first portion of the sample; irradiating a second portion of a sample holder with a second charged particle beam, wherein the irradiation of the second portion causes secondary electrons to be released to at least partially compensate the buildup of charge in the first portion of the sample; and translating the second charged particle beam without moving the first charged particle beam such that the distance between the region irradiated by the second charged particle beam in the sample plane and the region irradiated by the first charged particle beam in the sample plane changes.

B1. The method of paragraph B1, wherein the first charged particle beam is not translated when the second charged particle beam is translated.

B2. The method of paragraph B1, wherein the first charged particle beam and the second charged particle beams are electron beams.

B3. The method of paragraph B1, wherein the first charged particle beam and the second charged particle beams are ion beams.

B4. The method of any of paragraphs B1-B3, wherein the sample is an insulative material.

B4.1. The method of paragraph B4, wherein the sample is a biological sample.

B4.2. The method of any of paragraphs B4-B4.1, wherein the sample is amorphous.

B4.3. The method of any of paragraphs B4-B4.2, wherein the sample is cryogenic sample.

B4.4. The method of any of paragraphs B4-B4.3, wherein the sample is suspended in ice.

B4.5. The method of any of paragraphs B4-B4.4, wherein the sample comprises proteins suspended in amorphous ice.

B5. The method of any of paragraphs B1-B4.5, wherein the sample holder is electrically conductive.

B5.1. The method of paragraph B5, wherein the sample holder comprises a plurality of sample regions that allow TEM investigation of the corresponding samples.

B5.2. The method of any of paragraphs B5-B5.1, wherein the sample holder is a conductive foil that supports the plurality of sample regions.

B5.3. The method of any of paragraphs B5-B5.2, wherein the sample holder is a cryogenic sample holder for TEM samples.

B6. The method of any of paragraphs B1-B5.3, wherein the translation of the second charged particle beam is determined based on a type of sample grid that is holding the sample.

B7. The method of any of paragraphs B1-B5.3, wherein the translation of the second charged particle beam is determined based on a distance between the edge of the sample the first portion of the sample.

B8. The method of any of paragraphs B17, wherein the method is performed using the holey biprisim of any of paragraphs C1-C9.3.

C1. A holey biprism device, comprising: an electrically conductive body that is configured to at partially block a charged particle beam when used in a charged particle microscopy system to form at least a first charged particle beam, the body further defining an aperture positioned to allow at least a portion of the charged particle beam to pass through to form a second charged particle beam when used in the charged particle microscopy system; and a power source configured to apply a voltage to the body such that an electromagnetic field is generated that deflects the first charged particle beam in a sample plane while not affecting the position of the second charged particle beam in the sample plane.

C2. The holey biprisim device of paragraph C1, wherein the size of the deflection in the sample plane is based on the voltage applied to the body.

C3. The holey biprisim device of any of paragraphs C1-C2, wherein the power source is configured to change the voltage applied to body from a first voltage to a second voltage.

C3.1. The holey biprisim device of paragraph C3, wherein the change from the first voltage and the second voltage being applied to the body causes the distance between the first charged particle beam and the second charged particle beam in the sample plane to change.

C3.2. The holey biprisim device of any of paragraphs C3-3.1, wherein the power source is configured to determine a desired deflection of the first beam in the sample plane, and select a corresponding voltage to apply to the body to achieve the desired deflection.

C4. The holey biprisim device of any of paragraphs C1-C3.2, wherein the beam is an ion beam.

C5. The holey biprisim device of any of paragraphs C1-C3.2, wherein the beam is an electron beam.

C6. The holey biprisim device of any of paragraphs C1-C5, wherein the electrically conductive body is rectangular.

C7. The holey biprisim device of any of paragraphs C1-C6, wherein the electrically conductive body is symmetric along a plane perpendicular to the charged particle beam when the holey biprism is used in a charged particle microscopy system.

C8. The holey biprisim device of any of paragraphs C1-C7, wherein the electrically conductive body is positioned within an outer aperture that is defined by a holding body.

C8.1. The holey biprism device of paragraph C8, wherein the body splits the outer aperture into a first subaperture and a second subaperture.

C8.1.1. The holey biprism device of paragraph C8.1, wherein the first charged particle beam is the portion of the charged particle beam that passes through the first subaperture.

C8.1.2. The holey biprisim device of any of paragraphs C8-C8.1.1, wherein the portion of the charged particle beam that passes through the second subaperture is a third charged particle beam.

C8.2. The holey biprisim device of any of paragraphs C8-C8.1.2, wherein the holding body is configured to allow the body to be rotated about the emission axis of the charged particle beam to cause a rotation of the first charged particle beam in the sample plane.

C9. The holey biprisim device of any of paragraphs C1-C8.2, wherein the electrically conductive body is further configured to bisect the charged particle beam when used in the charged particle microscopy system so that the first charged particle beam and a third charged particle beam is formed.

C9.1. The holey biprisim device of paragraph C9, wherein the voltage applied to generates an electromagnetic field also deflects the third charged particle beam.

C9.2. The holey biprisim device of any of paragraphs C9-C9.1, wherein the electromagnetic field deflects the first charged particle beam and the third charged particle beam in equal amounts.

C9.3. The holey biprisim device of any of paragraphs C9-C9.2, wherein the electromagnetic field deflects the first charged particle beam and the third charged particle beam in opposite directions.

D1. Use of the system of any of paragraphs C1-C9.3 to perform the method of paragraphs B1-B8.

E1. A charged particle microscope for investigating a sample, the microscope comprising: a charged particle emitter configured to emit a charged particle beam towards a sample; a sample holder configured to hold the sample; a detector system configured to detect emissions resultant from the irradiation of the sample with the charged particle beam; one or more processors; and a memory, wherein the memory stores non-transitory computer readable instructions that, when executed on the one or more processors, cause the system to perform a method of any of paragraphs A1-A12.3 or B1-B8.

E2. The charged particle microscope of paragraph E1, further comprising the holey biprisim of any of paragraphs C1-C9.3.

F1. Use of D1 to perform A1 or B1

F2. Use of D1.1 to perform B1

F1. Use of the charged particle device of paragraph of any of paragraphs E1-E2 to perform the methods of any of A1-A12.3 or B1-B8.

F2. Use of the charged particle device of paragraph of any of paragraph E2 to perform the methods of any of paragraphs B1-B8.

G1. A computer readable medium storing non-transitory computer readable instructions that, when executed on one or more processors, cause the one or processors system to cause performance of a method of any of paragraphs A1-A12.3 or B1-B8.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "determine," "identify," "produce," and "provide" to describe the disclosed methods. These terms are high-level abstractions of the actual operations that are performed. The actual operations that correspond to these terms will vary depending on the particular implementation and are readily discernible by one of ordinary skill in the art.

What is claimed is:

1. A method for evaluating a sample with reduced sample charging, the method including:
    irradiating a first location on a sample during a first time period, wherein the irradiating the first location on the sample causes a gradual accumulation of net charge in the first location on the sample;
    generating, with a detector system, imaging data based on emissions resultant from irradiating the first location on the sample;
    irradiating a second location on a sample holder for a second time period, wherein the irradiating the second location on the sample holder causes secondary electrons to be released to compensate the accumulation of net charge; and
    iteratively repeating the irradiation of the first location and the second location during imaging of the sample region.

2. The method of claim 1, wherein the irradiating the first location on the sample causes a release of secondary electrons that results in a net loss of electrons in the first region of the sample, and the accumulation of net charge causes a non-uniform blur of images generated from the imaging data.

3. The method of claim 1, wherein the irradiating the second location on the sample holder causes a release of secondary electrons that at least partially become deposited in the first location on the sample that results in a net gain of electrons in the first region of the sample.

4. The method of claim 1, wherein the first time period is different from the second time period.

5. The method of claim 1, wherein the second time period is determined to sufficient to have the second region release sufficient electrons such that it negates the net charge built up during the first timer period.

6. The method of claim 1, wherein irradiating a first location on a sample and irradiating a first location on a sample comprises irradiating with an electron beam.

7. The method of claim 1, where in iteratively repeating the irradiation of the first location and the second location during imaging of the sample region comprises:
    irradiating the first location on the sample during a third time period, wherein the irradiating the first location on the sample causes a gradual accumulation of net charge in the first location on the sample;
    generating, with the detector system, additional imaging data based on emissions resultant from irradiating the first location on the sample during the third time period; and
    irradiating the second location on the sample holder for a fourth time period, wherein the irradiating the second location on the sample holder during the fourth time period causes secondary electrons to be released to compensate the accumulation of net charge in the first location on the sample.

8. The method of claim 1, further comprising blanking the charged particle beam between the first time period and the second time period to reduce irradiation damage in the region of the sample between the first location and the second location.

9. The method of claim 1, further comprising deflecting the charged particle beam such that the region being irradiated by the charged particle beam changes from the first location to the second location on.

10. The method of claim 9, wherein the deflecting the charged particle beam results in the charged particle beam causing irradiation damage to region of the sample between the first location and the second location.

11. The method of claim 9, wherein deflecting the charged particle beam further comprises deflecting the beam to a nearby region according to a predetermined pattern.

12. The method of claim 9, wherein deflecting the charged particle beam further comprises translating the charged particle beam directionally toward a closest electrically conductive area to the first location on the sample.

13. The method of claim 1, further comprising:
    irradiating a third location on the sample during a third time period, wherein the third location is different form the first location on the sample and the irradiating the third portion of the sample causes a gradual accumulation of net charge in the third location on the sample;

generating, with the detector system, additional imaging data based on emissions resultant from irradiating the third location on the sample during the third time period; and irradiating a fourth location on the sample holder for a fourth time period, wherein the irradiating the fourth location on the sample holder during the fourth time period causes secondary electrons to be released to compensate the accumulation of net charge.

14. The method of claim 1, wherein the method comprises continuing to image additional locations on the sample by iteratively irradiating a region of interest on the sample and a corresponding location on the sample holder.

15. The method of claim 14, wherein the continuing to image additional locations on the sample comprises determining the order of regions of interest and associated locations on the sample holder based on a predetermined pattern mapping, wherein the pattern mapping is configured such that each location on the sample that is imaged has not been previously damaged by prior irradiations.

16. The method of claim 1, wherein the first time period and the second period are determined based on:
    a charging rate of the sample; and
    a capture rate of a detector system.

17. The method of claim 1, wherein the sample is a biological sample suspended in ice.

18. A charged particle microscope for investigating a sample, the microscope comprising:
    a charged particle emitter configured to emit a charged particle beam towards a sample;
    a sample holder configured to hold the sample;
    a detector system configured to detect emissions resultant from the irradiation of the sample with the charged particle beam;
    one or more processors; and
        a memory, wherein the memory stores non-transitory computer readable instructions that, when executed on the one or more processors, cause the system to:
            irradiate a first location on the sample during a first time period, wherein the irradiating the first location on the sample causes a gradual deposit of charge in the first location on the sample;
            generate, with a detector system, imaging data based on emissions resultant from irradiating the first location on the sample;
            irradiate a second location on the sample holder for a second time period, wherein the irradiating the second location on the sample holder causes secondary electrons to be released to compensate the deposit of charge; and
            iteratively repeat the irradiation of the first location and the second location during imaging of the sample region.

19. The charged particle microscope system of claim 18, wherein the instructions further cause the system to continue to image additional location on the sample by iteratively irradiating a region of interest on the sample and a corresponding location on the sample holder.

20. A computer readable medium storing non-transitory computer readable instructions that, when executed on one or more processors, cause the one or processors system to cause a charged particle microscope system to:
    irradiate a first location on a sample during a first time period, wherein the irradiating the first location on the sample causes a gradual deposit of charge in the first location on the sample;
    generate, with a detector system, imaging data based on emissions resultant from irradiating the first location on the sample;
    irradiate a second location on a sample holder for a second time period, wherein the irradiating the second location on the sample holder causes secondary electrons to be released to compensate the deposit of charge; and
    iteratively repeat the irradiation of the first location and the second location during imaging of the sample region.

* * * * *